(12) United States Patent
Isozaki

(10) Patent No.: US 6,608,384 B2
(45) Date of Patent: Aug. 19, 2003

(54) SEMICONDUCTOR DEVICE AND METHOD OF FORMING THE SAME

(75) Inventor: Seiya Isozaki, Tokyo (JP)

(73) Assignee: Nec Corporation, Tokyo (JP)

( * ) Notice: Subject to any disclaimer, the term of this patent is extended or adjusted under 35 U.S.C. 154(b) by 0 days.

(21) Appl. No.: 09/920,754

(22) Filed: Aug. 3, 2001

(65) Prior Publication Data

US 2002/0017725 A1 Feb. 14, 2002

(30) Foreign Application Priority Data

Aug. 3, 2000 (JP) ........................................ 2000-235113

(51) Int. Cl.[7] ................................................ H01L 23/52
(52) U.S. Cl. .................. 257/772; 257/778; 257/786; 257/787; 257/789; 361/260; 361/743; 361/719; 361/762; 438/125; 438/126
(58) Field of Search ................... 257/778, 786, 257/787, 789, 675, 719, 678, 772, 773, 774, 777, 734–738; 361/760, 743, 719, 762

(56) References Cited

U.S. PATENT DOCUMENTS

| | | | | |
|---|---|---|---|---|
| 5,810,609 | A | * | 9/1998 | Faraci et al. ................... 439/71 |
| 6,169,328 | B1 | * | 1/2001 | Mitchell et al. ............. 257/778 |
| 6,194,291 | B1 | * | 2/2001 | DiStefano et al. .......... 438/455 |
| 6,350,668 | B1 | * | 2/2002 | Chakravorty ............... 438/612 |
| 6,407,927 | B1 | * | 6/2002 | Fasano ......................... 361/70 |
| 6,426,545 | B1 | * | 7/2002 | Eichelberger et al. ...... 257/633 |
| 2002/0241241 | | * | 2/2002 | Hashimoto .................. 257/678 |

* cited by examiner

*Primary Examiner*—Nathan J. Flynn
*Assistant Examiner*—Fazli Erdem
(74) *Attorney, Agent, or Firm*—Young & Thompson

(57) ABSTRACT

A semiconductor device includes a bonding-structure for electrically and mechanically bonding a solder ball to the electrode pad. The bonding-structure includes flexible arms that are connected to a common supporting layer that allows a relative displacement of the solder ball in relation to the semiconductor chip. The arms extending in one direction are supported by one supporting layer and the arms extending in an opposite direction are supported by another supporting layer.

29 Claims, 24 Drawing Sheets

SEMICONDUCTOR DEVICE AND METHOD OF FORMING THE SAME

BACKGROUND OF THE INVENTION

1. Field of the Invention

The present invention relates to a semiconductor device, wherein a semiconductor chip is flip-chip-bonded onto a mounting board, and more particularly to an improved thermally stable flip-chip-bonding structure between a semiconductor chip and a mounting board.

2. Description of the Related Art

FIG. 1 is a fragmentary cross sectional view of a conventional flip-chip-bonding structure between a semiconductor chip and a mounting board. A junction layer 23 is adhered through an adhesive layer 25 to a semiconductor chip 21. Electrode pads (not illustrated) are provided on the semiconductor chip 21. A through hole is provided which penetrates the adhesive layer 25 and the junction layer 23. A plug 22 is provided in the through hole, so that the plug 22 is in contact with t e electrode pad.

A metal wiring layer 24 is provided which extends on the junction layer 23, wherein the metal wiring layer 24 is connected through the plug 22 to the through hole. A cover layer 27 is provided which covers the metal wiring layer 24 and the junction layer 23. The cover layer 27 has an opening, through which a solder ball 26 is connected to the metal wiring layer 24. The solder ball 26 is bonded to a non-illustrated wiring which extends over a mounting board 29.

The semiconductor chip 21, the junction layer 23 and the mounting board 29 are made of different materials, and are different from each other in thermal expansion coefficient. Operations of the semiconductor chip 21 generates a heat which is transmitted to the junction layer 23 and the mounting board 29, whereby the semiconductor chip 21, the junction layer 23 and the mounting board 29 show respective different thermal expansions due to the different thermal expansion coefficients. Those different thermal expansions apply a shearing stress to the solder ball 26, whereby a crack 28 appears the solder ball 26. FIG. 2 is a fragmentary cross sectional view of a broken flip-chip-bonding structure of FIG. 1 upon application of shearing stress due to different thermal expansion coefficients, If the junction layer 23 and the mounting board 29 are made of the same material, then the junction layer 23 receives an influence of thermal expansion of the semiconductor chip 21. For this reason, the junction layer 23 and the mounting board 29 are different in effective thermal extension coefficient, thereby to apply a shearing stress to the solder ball 26, so that the crack 28 also appears the solder ball 26.

In the above circumstances, the development of a novel flip-chip-bonding structure between a semiconductor chip and a mounting board free from the above problems is desirable.

SUMMARY OF THE INVENTION

Accordingly, it is an object of the present invention to provide a novel flip-chip-bonding structure between a semiconductor chip and a mounting board free from the above problems.

It is a further object of the present invention to provide a novel thermally stable flip-chip-bonding structure between a semiconductor chip and a mounting board.

It is a further object of the present invention to provide a novel thermally stable flip-chip-bonding structure which is capable of absorbing a stress due to differences in thermal expansion coefficient between the semiconductor chip and the mounting board.

It is a further object of the present invention to provide a novel thermally stable flip-chip-bonding structure which is capable of absorbing a stress due to differences in thermal absorbing coefficient between the semiconductor chip and the mounting board.

It is a further object of the present invention to provide a novel highly reliable flip-chip-bonding structure between a semiconductor chip and a mounting board.

It is a further object of the present invention to provide a novel flip-chip-bonding structure which allows an easy sealing to electrode pads over the semiconductor chip.

It is another object of the present invention to provide a novel method of forming a flip-chip-bonding structure between a semiconductor chip and a mounting board free from the above problems, It is a further object of the present invention to provide a novel method of forming a thermally stable flip-chip-bonding structure between a semiconductor chip and a mounting board.

It is a further object of the present invention to provide a novel method of forming a thermally stable flip-chip-bonding structure which is capable of absorbing a stress due to differences in thermal expansion coefficient between the semiconductor chip and the mounting board.

It is a further object of the present invention to provide a novel method of forming a thermally stable flip-chip-bonding structure which is capable of absorbing a stress due to differences in thermal absorbing coefficient between the semiconductor chip and the mounting board.

It is a further object of the present invention to provide a novel method of forming a highly reliable flip-chip-bonding structure between a semiconductor chip and a mounting board.

It is a further object of the present invention to provide a novel method of forming a flip-chip-bonding structure which allows an easy sealing to electrode pads over the semiconductor chip.

The present invention provides a semiconductor device comprising: a semiconductor chip having at least an electrode pad; at least a solder material; and at least a bonding-structure for electrically and mechanically bonding the solder material to the electrode pad, wherein the bonding-structure has a flexibility and allows a relative displacement of the solder material in relation to the semiconductor chip.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
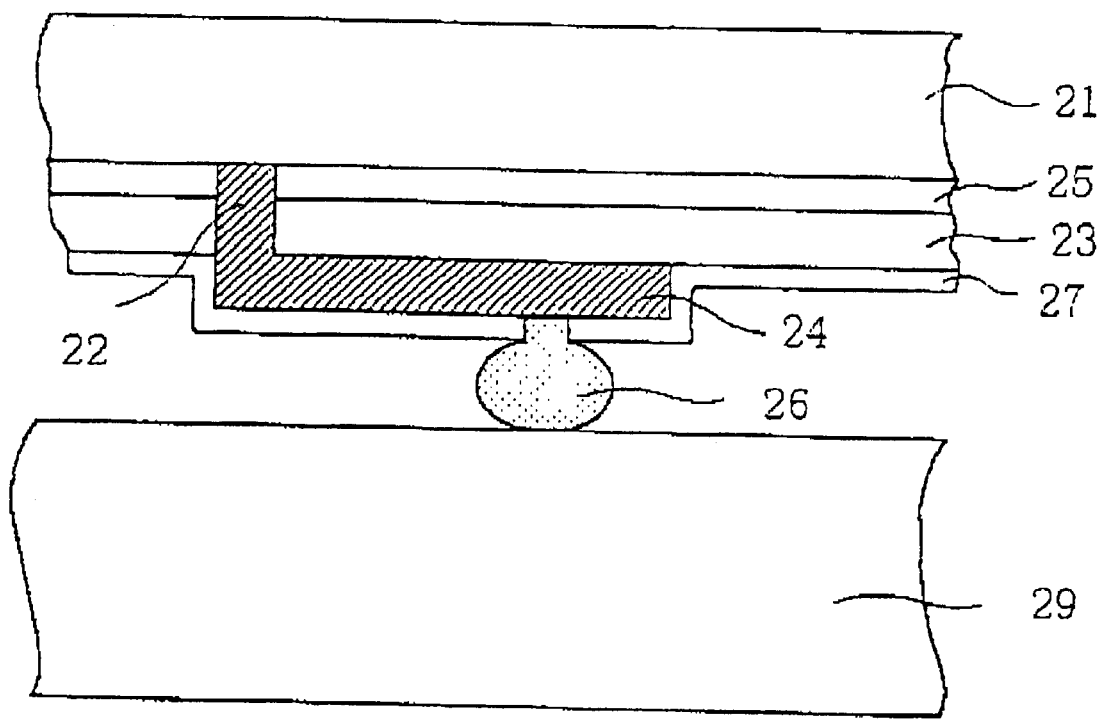
FIG. 1 is a fragmentary cross sectional view of a conventional flip-chip-bonding structure between a semiconductor chip and a mounting board.
Figure 2:
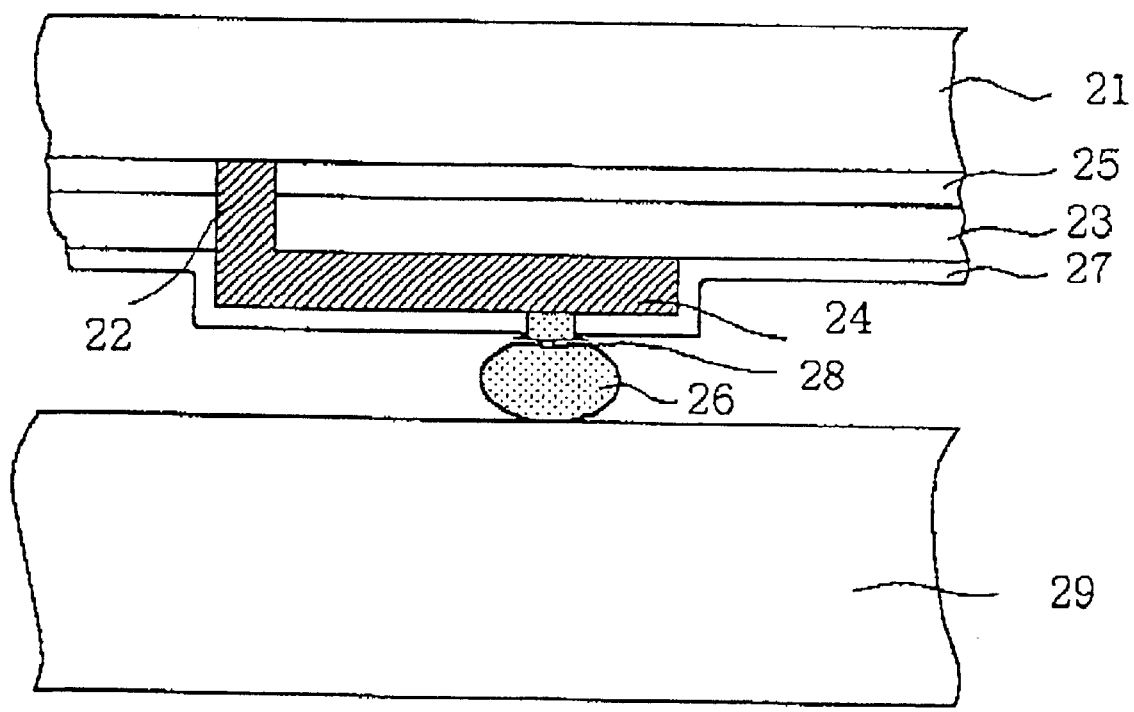
FIG. 2 is a fragmentary cross sectional view of a broken flip-chip-bonding structure of FIG. 1 upon application of shearing stress due to different thermal expansion coefficients.

A first aspect of the present invention is a semiconductor device comprising: a semiconductor chip having at least an electrode pad; at least a solder material; and at least a bonding-structure for electrically and mechanically bonding the solder material to the electrode pad, wherein the bonding-structure has a flexibility and allows a relative displacement of the solder material in relation to the semiconductor chip, It is preferable that the bonding-structure having at least a fixed portion which is fixed to the electrode pad and at least a free portion other than the fixed portion, and the free portion is allowed to be displaced in relation to the semiconductor chip. It is further preferable that the bonding-structure extends generally in parallel to a surface of the semiconductor chip. It is further more preferable that the bonding-structure comprises at least an electrically conductive projection fixed to the electrode pad; and at least a wiring layer having a fixed end which is fixed to the metal projection and a free end opposite to the fixed end, and the free end being fixed with the solder, and the free end being allowed to be displaced in relation to the semiconductor chip. It is moreover preferable that the bonding-structure further comprises a sealing resin material which seals the fixed end and the electrically conductive projection.

It is also preferable that the bonding-structure further comprises a reinforcement resin material in contact with the solder material and the free end.

It is also preferable that the wiring layer extends in a straight from.

It is also preferable that the wiring layer extends in a bent from.

It is also preferable that the bonding-structure comprises; a plurality of the electrically conductive projections fixed to a plurality of the electrode pad; and a plurality of the wiring layers having fixed ends which are fixed to the metal projections and free ends which are fixed to a plurality of the solder materials, the free ends being allowed to be displaced in relation to the semiconductor chip. It is further preferable that at least two of the plurality of wiring layers extend in a first direction and are adhered to a common supporting layer for keeping the wiring layers extending in parallel to each other. It is moreover preferable that the common supporting layer is made of an insulating material.

It is also preferable that the wiring layers extend in a uniform direction and are adhered to a common supporting layer for keeping the wiring layers extending in parallel to each other. It is further more preferable that the wiring layers have a uniform length. It is moreover preferable that the wiring layer extends in a straight from.

It is also preferable that the wiring layer extends in a bent from.

It is also preferable that the plurality of wiring layers comprise short and long wiring layers which are alternately aligned in a direction perpendicular to a uniform direction, along which the short and long wiring layers extend, wherein the short and long wiring layers are adhered to a first common supporting layer and the long wiring layers are adhered to a second common supporting layer which is positioned outside the first common supporting layer for keeping the short and long wiring layers extending in parallel to each other. It is further preferable that the wiring layer extends in a straight from, It is also preferable that the plurality of wiring layers comprise first set wiring layers and second set wiring layers, wherein the first set wiring layers extend in a first direction and are adhered to a first common supporting layer for keeping the first set wiring layers extending in parallel to each other, and wherein the second set wiring layers extend in a second direction anti-parallel to the first direction and the second set wiring layers are adhered to a second common supporting layer for keeping the second set wiring layers extending in parallel to each other. It is further preferable that the first and second set wiring layers have a uniform length. It is further more preferable that the wiring layer extends in a straight from. It is moreover preferable that the wiring layer extends in a bent from, It is also preferable that the plurality of wiring layers comprise first set wiring layers having a first length, second set wiring layers having a second length longer than the first length, third set wiring layers having a third length and fourth set wiring layers having a fourth length longer than the third length, wherein the first and second set wiring layers are alternately aligned in a direction perpendicular to a first direction, along which the first and second set wiring layers extend, wherein the third and fourth set wiring layers are alternately aligned in a direction perpendicular to a second direction, along which the third and fourth set wiring layers extend, and the second direction being anti-parallel to the first direction, wherein the first and second set wiring layers are adhered to a first common supporting layer and the second set wiring layers are adhered to a second common supporting layer which is positioned outside the first common supporting layer for keeping the first and second set wiring layers extending in parallel to each other, and wherein the third and fourth set wiring layers are adhered to a third common supporting layer and the fourth set wiring layers are adhered to a fourth common supporting layer which is positioned outside the third common supporting layer for keeping the third and fourth set wiring layers extending in parallel to each other. It is further preferable that the wiring layer extends in a straight from.

It is also preferable to further comprise a mounting board bonded with the solder material.

Operations of the semiconductor chip generates a heat which is transmitted to the mounting board, whereby the semiconductor chip and the mounting board show respective different thermal expansions due to the different thermal expansion coefficients. Those different thermal expansions is absorbed and relaxed by the above novel bonding structure with the flexibility, for example, the flexible metal wiring layers, so that no large shearing stress is applied to the solder balls, and no crack appears the solder balls.

If any external force or any external mechanical stress due to any physical factors such as the bending of the mounting board is applied to between the mounting board and the semiconductor chip, then the external force or any external mechanical stress is also absorbed and relaxed by the above novel bonding structure with the flexibility, for example, the flexible metal wiring layers, so that substantially no shearing stress is applied to the solder balls, and no crack appears the solder balls.

A second aspect of the present invention is a semiconductor device comprising: a semiconductor chip having a plurality of electrode pads a plurality of solder balls; a plurality of metal wiring layers extending generally in parallel to a surface of the semiconductor chip, the metal wiring layers electrically and mechanically bonding the solder balls to the electrode pads; and a mounting board bonded with the solder balls, wherein the metal wiring layers have a flexibility and allow a relative displacement of the mounting board in relation to the semiconductor chip, It is preferable that each of the metal wiring layers has a fixed end which is connected through a metal projection to each of the electrode pads, and each of the metal wiring layers has a free end being fixed with each of the solder balls. It is further preferable that the fixed ends and the metal projections are sealed with a sealing resin material.

It is also preferable that the solder balls and the free ends are reinforced by a reinforcement resin material.

It is also preferable that each of the metal wiring layers extends in a straight from.

It is also preferable that each of the wiring layers extends in a bent from.

It is also preferable that at least two of the metal wiring layers extend in a first direction and are adhered to a common supporting layer for keeping the metal wiring layers extending in parallel to each other. It is further preferable that the common supporting layer is made of an insulating material.

It is also preferable that the metal wiring layers extend in a uniform direction and are adhered to a common supporting layer for keeping the wiring layers extending in parallel to each other. It is further preferable that the wiring layers have a uniform length. It is further preferable that the wiring layer extends in a straight from.

It is also preferable that the wiring layer extends in a bent from.

It is also preferable that the metal wiring layers comprise short and long wiring layers which are alternately aligned in a direction perpendicular to a uniform direction, along which the short and long wiring layers extend, wherein the short and long wiring layers are adhered to a first common supporting layer and the long wiring layers are adhered to a second common supporting layer which is positioned outside the first common supporting layer for keeping the short and long wiring layers extending in parallel to each other. It is further preferable that the wiring layer extends in a straight from.

It is preferable that the metal wiring layers comprise first set wiring layers and second set wiring layers, wherein the first set wiring layers extend in a first direction and are adhered to a first common supporting layer for keeping the first set wiring layers extending in parallel to each other, and wherein the second set wiring layers extend in a second direction anti-parallel to the first direction and the second set wiring layers are adhered to a second common supporting layer for keeping the second set wiring layers extending in parallel to each other. It is further preferable that the first and second set wiring layers have a uniform length. It is further more preferable that the wiring layer extends in a straight from.

It is also preferable that the wiring layer extends in a bent from.

It is also preferable that the metal wiring layers comprise first set wiring layers having a first length, second set wiring layers having a second length longer than the first length, third set wiring layers having a third length and fourth set wiring layers having a fourth length longer than the third length, wherein the first and second set wiring layers are alternately aligned in a direction perpendicular to a first direction, along which the first and second set wiring layers extend, wherein the third and fourth set wiring layers are alternately aligned ill a direction perpendicular to a second direction, along which the third and fourth sot wiring layers extend, and the second direction being anti-parallel to the first direction, wherein the first and second set wiring layers are adhered to a first common supporting layer and the second set wiring layers are adhered to a second common supporting layer which is positioned outside the first common supporting layer for keeping the first and second set wiring layers extending in parallel to each other, and wherein the third and fourth set wiring layers are adhered to a third common supporting layer and the fourth set wiring layers are adhered to a fourth common supporting layer which is positioned outside the third common supporting layer for keeping the third and fourth set wiring layers extending in parallel to each other. It is further preferable that the wiring layer extends in a straight from.

This second aspect of the present invention has the same characteristics described above in connection with the first aspect of the present invention.

A third aspect of the present invention is a method of forming a semiconductor device, comprising the steps of: forming at least a bonding-structure having a flexibility and an electrical conductivity on a base substrate; bonding at least a fixed portion of the at least bonding-structure to at least an electrode pad of a semiconductor chip removing the base substrate from the at least bonding-structure; bonding at least a solder material to at least a free portion of the at least bonding-structure; and bonding the at least solder material to a mounting board, wherein the bonding-structure allows a relative displacement between, the semiconductor chip and the mounting board.

It is preferable to further comprise the step of sealing the at least fixed portion and the at least electrode pad with a sealing material before removing the base substrate from the at least bonding-structure.

It is preferable to further comprise the step of applying a reinforcement resin material in contact with the solder material and the free portion.

It is preferable that the step of forming at least a bonding-structure comprises the steps of: selectively forming plural wiring layers on the base substrate; selectively forming a common supporting layer extending over parts of the plural wiring layers and the base substrate; and providing electrically conductive projections at fixed ends of the plural wiring layers, so that the electrically conductive projections are bonded to the electrode pads of the semiconductor chip.

This third aspect of the present invention has the same characteristics described above in connection with the first aspect of the present invention.

Figure 3:
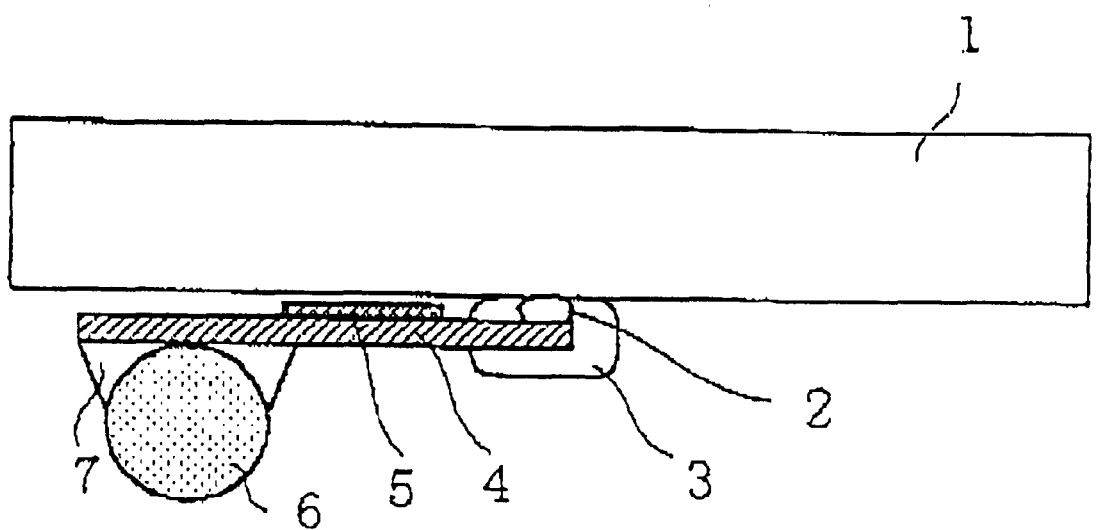
FIG. 3 is a cross sectional elevation view of a first novel flip-chip bonding structure of a semiconductor chip in a first embodiment in accordance with the present invention.
Figure 4:
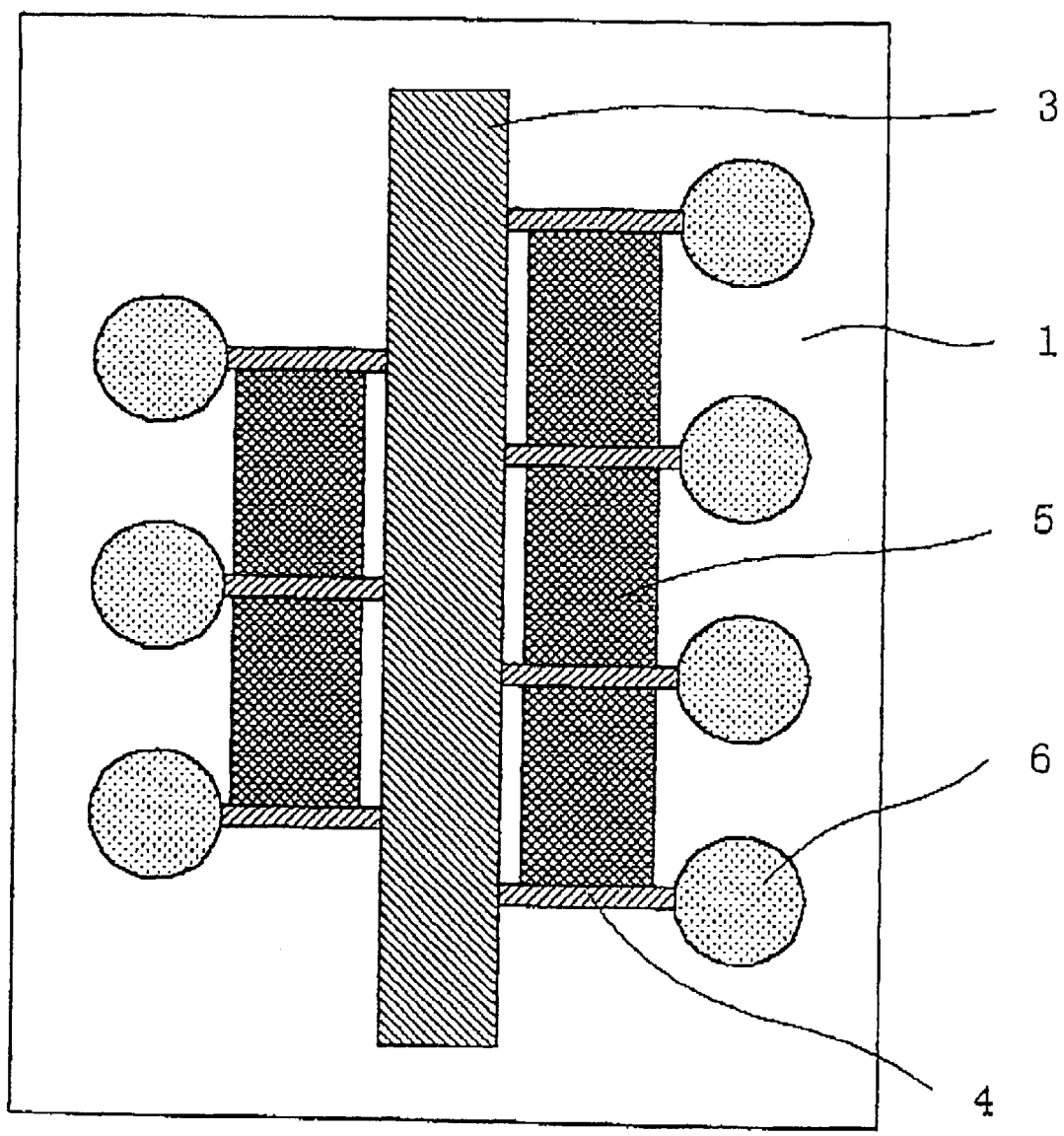
FIG. 4 is a plan view of the first novel flip-chip bonding structure of FIG. 3.
Figure 5:
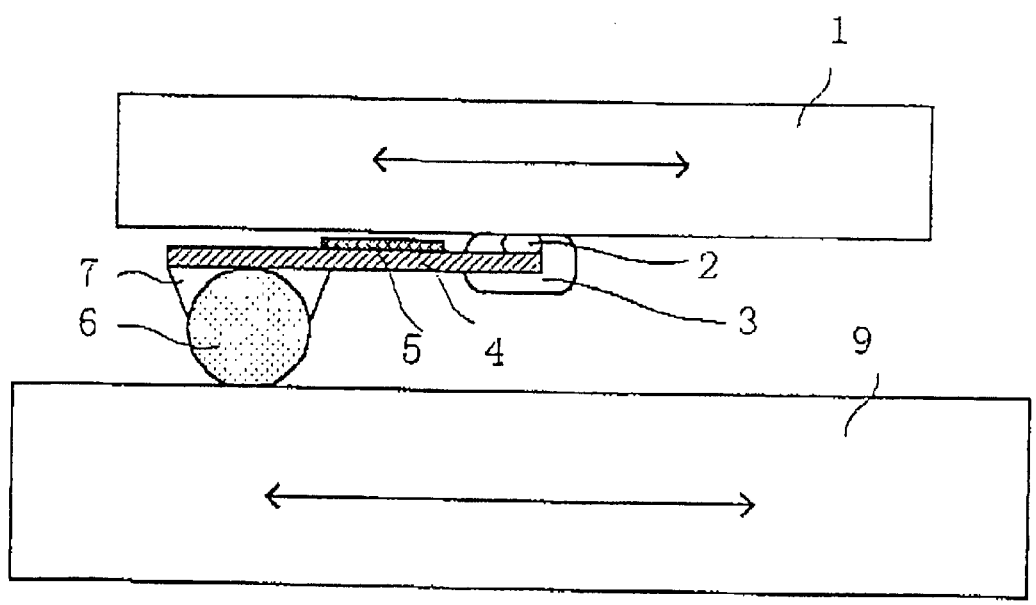
FIG. 5 is a cross sectional elevation view of a semiconductor device which comprises a semiconductor chip and a mounting board which are bonded to each other an improved bonding structure shown in FIG. 3.

A first embodiment according to the present invention will be described in detail with reference to the drawings. FIG. 3 is a cross sectional elevation view of a first novel flip-chip bonding structure of a semiconductor chip in a first embodiment in accordance with the present e invention. FIG. 4 is a plan view of the first novel flip-chip bonding structure of FIG. 3. For simplification, FIG. 3 illustrates only the one side bonding structure, even the bonding structures are actually provided in both sides as shown in FIG. 4. For further simplification, FIG. 4 illustrates only the simplified bonding structures, wherein seven metal wiring layers are illustrated even actually fifty two metal wiring layers are provided. FIG. 5 is a cross sectional elevation view of a semiconductor device which comprises a semiconductor chip and a mounting board which are bonded to each other an improved bonding structure shown in FIG. 3.

A semiconductor device includes a semiconductor chip 1 having a plurality of electrode pads which are not illustrated. The semiconductor de y ice further includes a plurality of solder balls 6 which are bonded with a mounting board 9. The improved bonding structure electrically and mechanically bonds the solder balls to the electrode pads. The bonding structure may comprise a plurality of metal wiring layers 4 extending generally in parallel to a surface of the semiconductor chip 1. Each of the metal wiring layers has a fixed end which is connected through a metal projection 2 to each of the electrode pads of the semiconductor chip 1. Each of the metal wiring layers 4 has a free end fixed to a respective one of the solder balls 6. Each of the metal wiring layers 4 is straight. The metal wiring layers 4 have a uniform length. The fixed ends of the metal wiring layers 4 and the metal projections 2 are sealed with a sealing resin material 3. The sealing resin material 3 protects the junction between the fixed ends of the metal wiring layers 4 and the metal projections 2. The solder balls 6 and the free ends of the metal wiring layers 4 are reinforced by a reinforcement resin material 7.

The metal wiring layers 4 may comprise first set wiring layers 4 and second set wiring layers 4. The first set wiring layers 4 extend in a first direction and are adhered to a first common supporting layer 5 for keeping the first set wiring layers 4 extending in parallel to each other. The second set wiring layers 4 extend in a second direction anti-parallel to the first direction and the second set wiring layers 4 are adhered to a second common supporting layer 5 for keeping the second set wiring layers extending in parallel to each other. The first and second common supporting layers 5 may comprise resin films. The first common supporting layer 5 may be shaped in stripe which extends over the first set wiring layers 4. The second common supporting layer 5 may be shaped in stripe which extends over the second set wiring layers 4. The metal projections 2 may comprise metal bumps, for example, gold bumps.

The metal wiring layers 4 have a flexibility and allow a relative displacement of the mounting board 9 in relation to the semiconductor chip 1. The supporting layers 5 also have a flexibility so as to allow a deformation of the metal wiring layers 4 to allow the relative displacement of the mounting board 9 in relation to the semiconductor chip 1. The semiconductor chip 1 may comprise a silicon chip which has a thermal expansion coefficient of $3\times10^{-6}$/K. The mounting board 9 may comprise a glass epoxy board which has a thermal expansion coefficient of $14\times10^{-6}$/K. The glass epoxy mounting board 9 is higher by about five times in thermal expansion coefficient than the silicon chip 1.

Operation of the semiconductor chip 1 generates heat which is transmitted to the mounting board 9, whereby the semiconductor chip 1 and the mounting board 9 show respective different thermal expansions due to the different thermal expansion coefficients. Those different thermal expansions are absorbed and relaxed by the flexible metal wiring layers 4, so that no large shearing stress is applied to the solder balls 6, and no crack appears at the solder balls 6.

If any external force or any external mechanical stress due to any physical factors such as the bending of the mounting board is applied between the mounting board 9 and the A semiconductor chip then the external force or any external mechanical stress is also absorbed and relaxed by the flexible metal wiring layers 4, so that substantially no shearing stress is applied to the solder balls 6, and no crack appears at the solder balls 6.

The above novel bonding structure shown in FIGS. 3, 4 and 5 may be modified as follows.

Figure 6:
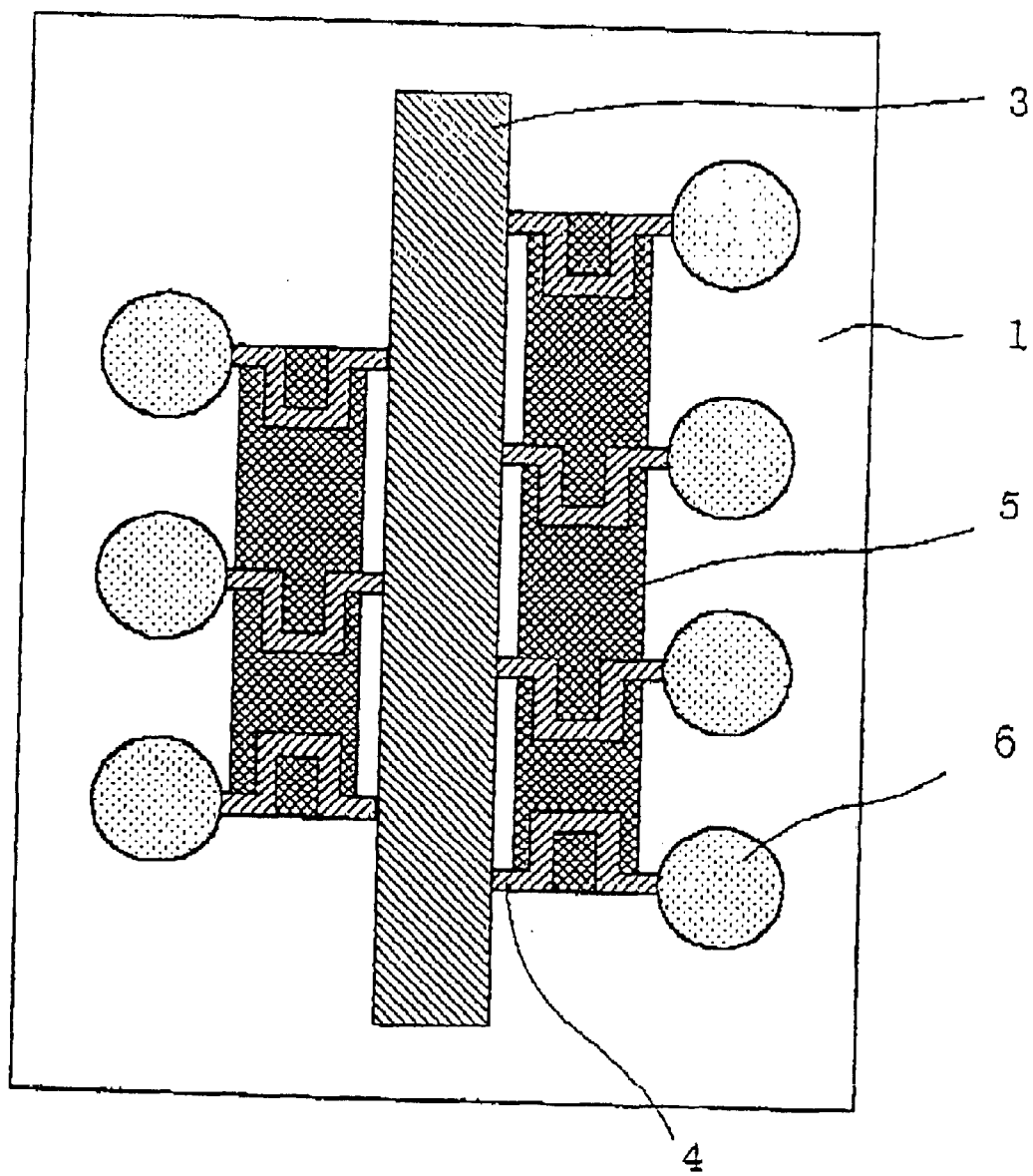
FIG. 6 is a plan view of a modified bonding structure of a semiconductor device in accordance with the present invention.

FIG. 6 is a plan view of a modified bonding structure of a semiconductor device in accordance with the present invention. A difference of this first-modified bonding structure of FIG. 6 from the above novel bonding structure of FIG. 4 is in the shape of each of the metal wiring layers 4. In the above novel bonding structure of FIG. 4, each of the metal wiring layers 4 extends in the straight shape as described above. By contrast, in accordance with the first-modified bonding structure of FIG. 6, each of the metal wiring layers 4 extends in the bent shape, for example, a double-crank shape.

This bent shaped portion, for example, the double-crank shaped portion is likely to be bent rather than when the metal wiring layer is the straight shape. This bent shaped portion provides the metal wiring layers 4 with higher flexibility allowing a relative displacement of the mounting board 9 in relation to the semiconductor chip 1, whereby the bent shaped portion has a higher effect of absorbing and relaxing the external force or any external mechanical stress.

If a heat is generated from the semiconductor chip 1, then the semiconductor chip 1 and the mounting board 9 show respective different thermal expansions due to the different thermal expansion coefficients. Those different thermal expansions are highly absorbed and relaxed by the flexible metal wiring layers 4 with the bent shaped portion, so that no large shearing stress is applied to the solder balls 6, and no crack appears at the solder balls 6.

Figure 7:
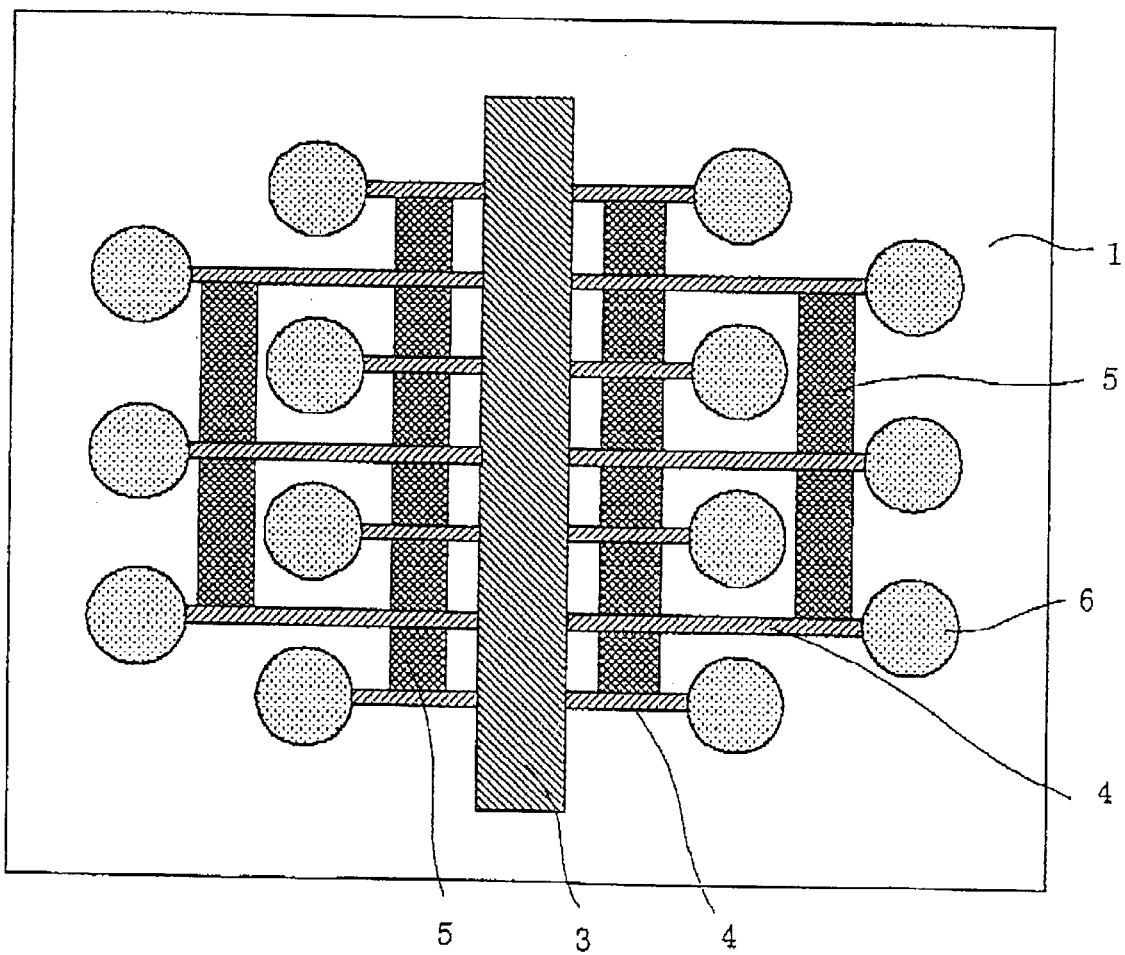
FIG. 7 is a plan view of another modified bonding structure of a semiconductor device in accordance with the present invention.

FIG. 7 is a plan view of another modified bonding structure of a semiconductor device in accordance with the present invention. A difference of this second-modified bonding structure of FIG. 7 from the above novel bonding structure of FIG. 4 is in the variation in length of the metal wiring layers 4. In the above novel bonding structure of FIG:. 4, the metal wiring layers 4 have a uniform length. By contrast, in accordance with the second-modified bonding structure of FIG. 7, the metal wiring layers 4 are classified into short and long metal wiring layers 4.

The short and long metal wiring layers 4 are alternately aligned in a direction perpendicular to the direction along which the metal wiring layers 4 extends, so as to form dual-alignments of the solder balls 6, for example, inside and outside alignments of inside solder balls and outside solder balls. The inside and outside solder balls are alternately aligned in the direction perpendicular to the direction along which the metal wiring layers 4 extends. A pitch of alternating alignment of the short and long metal wiring layers 4 is shorter than the normal alignment of the uniform length metal wiring layers 4. The dual alignments of the solder balls 6 allows a high distribution density of the solder balls 6 and a short pitch of the alignment of the metal wiring layers 4.

Further, inside and outside supporting layers 5 are provided. The inside supporting layer 5 extends across both the short and long metal wiring layers 4 in the direction perpendicular to the direction along which the metal wiring layers 4 extends. The inside supporting layer 5 is positioned inside the inside alignment of the inside solder balls 6. The outside supporting layer 5 extends across only the long metal wiring layers 4 in the direction perpendicular to the direction along which the metal wiring layers 4 extends. The outside supporting layer 5 is positioned outside the inside alignment of the inside solder balls 6 and inside the outside alignment of the outside solder balls 6.

The dual alignments of the solder balls 6 allows a high distribution density of the solder balls 6 and a short pitch of the alignment of the metal wiring layers 4. This allows a high density packaging of the semiconductor device.

The above novel semiconductor device with the improved bonding structures may be formed by various available methods. The followings are three examples of the available method of forming the novel semiconductor device with the improved bonding structures.

Figure 8A:
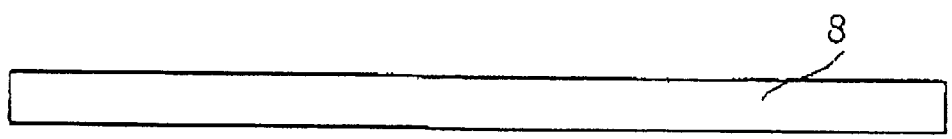
FIGS. 8A through 8K are fragmentary cross sectional elevation views of semiconductor devices with the improved bonding structures in sequential steps involved in a first example of the fabrication method in accordance with the present invention.
Figure 8B:
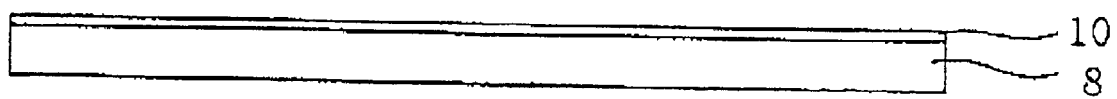
Figure 8C:
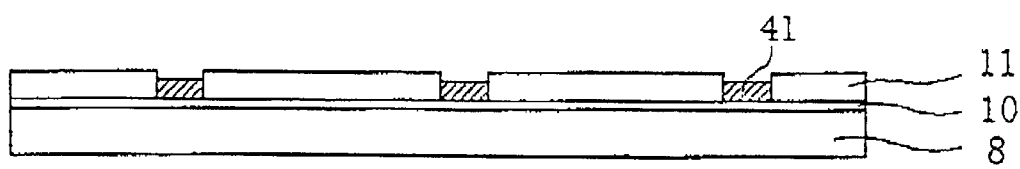
Figure 8D:
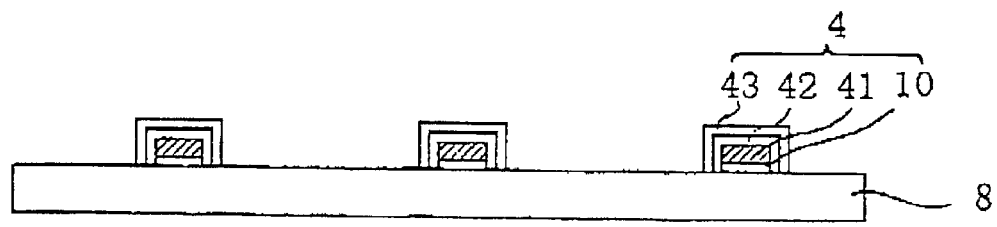
Figure 8E:
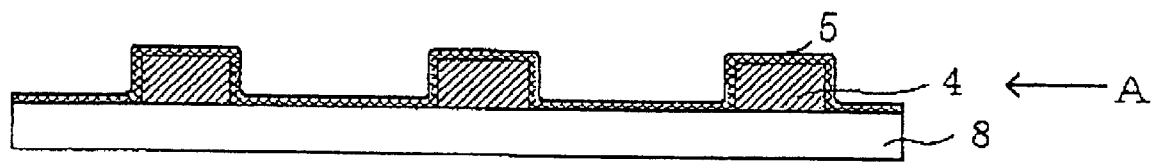
Figure 8F:
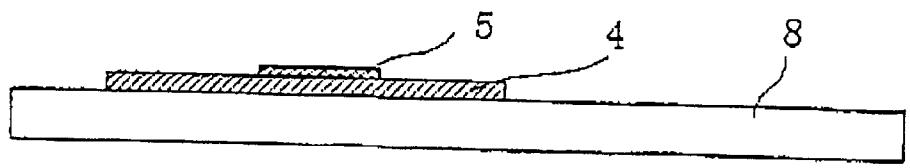

FIGS. 8A through 8K are fragmentary cross sectional elevation views of semiconductor devices with the improved bonding structures in sequential steps involved in a first example of the fabrication method in accordance with the present invention. The views of the semiconductor devices are different by 90 degrees between FIGS. 8A through 8E and FIGS. 8F through 8K. In FIGS. 8F through 8K, right side bonding structures are not illustrated, even actually the left side and right side bonding structures are provided. FIGS. 8E and 8F are illustrative of the semiconductor device in one step, but FIG. 8F is a view from an arrow mark "A" in FIG. 8E.

With reference to FIG. 8A, a base substrate 8 as a supporter is prepared, wherein the base substrate 8 may comprise a polyimide tape.

With reference to FIG. 8B, a metal thin film 10 is formed on an entire upper surface of the base substrate 8 by an electroless plating method, wherein the metal thin film 10 may comprise a copper film.

With reference to FIG. 8C, a resist pattern 11 is formed on the metal thin film 10 by lithography processes. Copper-plated layers 41 are selectively formed on the metal thin film 10 by an electroplating method using the resist pattern 11 as a mask.

With reference to FIG. 8D, the resist pattern 11 is removed. The metal thin film 10 is then removed except under the copper-plated layers 41. Nickel-plated layers 42 are formed on surfaces of the copper-plated layers 41. Further, gold-plated layers 43 are formed on surfaces of the nickel-plated layers 42. Lamination structures of the metal thin film 10, the copper-plated layers 41, the nickel-plated layers 42 and the gold-plated layers 43 form wiring layers 4 which extend over the base layer 8.

With reference to FIGS. 8E and 8F, an epoxy-based liquid state resin material is applied selectively over the base layer 8 and the wiring layers 4. The applied epoxy-based liquid state resin material is then subjected to a heat treatment and a thermosetting process to form a supporting resin layer 5 which extends over the base layer 8 and the wiring layers 4.

Figure 8G:
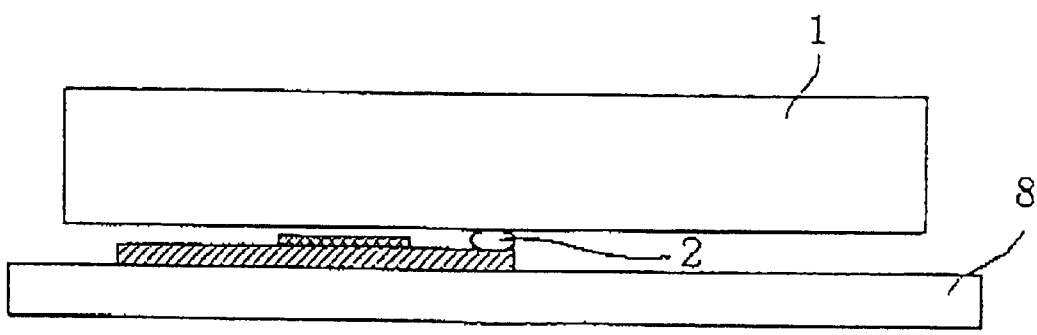

With reference to FIG. 8G, the base substrate 8 is aligned to a semiconductor chip 1 which has been formed with metal projections 2, so that the first ends of the metal wiring layers 4 are aligned to the metal projections 2. A heat treatment is carried out at 270° C., and a pressure of 50.96N (5.2 kg) is applied for 10 seconds between the semiconductor chip 1 and the base substrate 8, whereby the first ends of the metal wiring layers 4 are bonded to the metal projections 2.

Figure 8H:
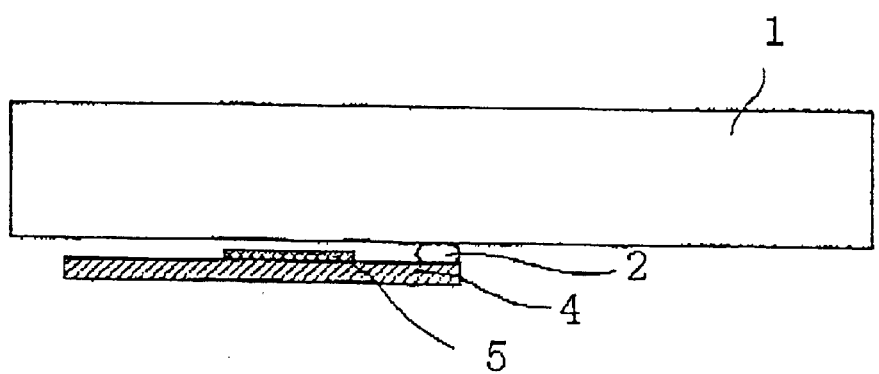

With reference to FIG. 8H, the base substrate 8 is mechanically peeled. As described above, the base substrate 8 comprises a polyimide tape. The polyimide tape has an extremely smooth surface. No metal adhesive nor adhesive agent is used between the metal wiring layers 4 and the base substrate 8. The base substrate 8 has a weak peeling intensity to the metal wiring layers 4 and the supporting layer 5. The peeling intensity is in the range of, for example, 1.96 N/cm to 2.94 N/cm (200–300 g/cm). For this reason, it is possible to peel the base substrate 8 from the metal wiring layers 4 and the supporting layer 5, without providing any damage to the metal wiring layers 4 and the supporting layer 5.

Figure 8I:
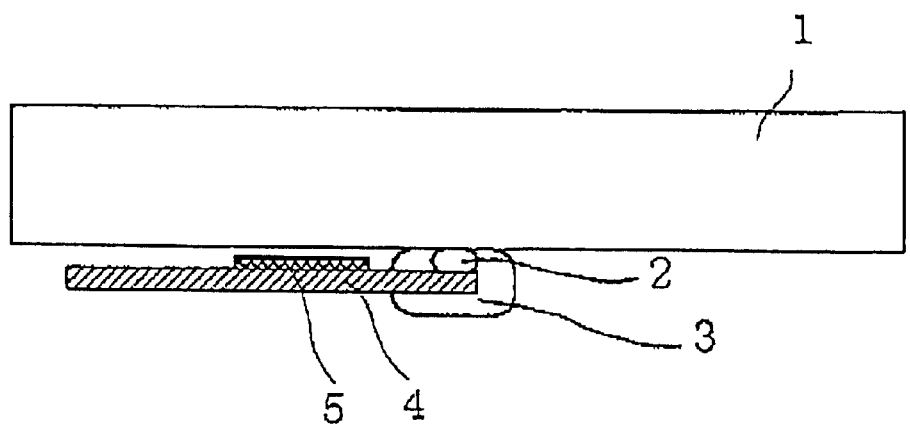

With reference to FIG. 8I, an epoxy-based liquid state resin material 3 is applied selectively on the first ends of the metal wiring layers 4, the metal projections 2 and the electrode pads of the semiconductor chip 1. The applied epoxy-based liquid state resin material 3 is then subjected to sequential thermosetting processes at 80° C. for 30 minutes and then at 150° C. for 120 minutes for forming scaling resins 3 which protect the junctions of the first ends of the metal wiring layers 4 through the metal projections 2 to the electrode pads.

Figure 8J:
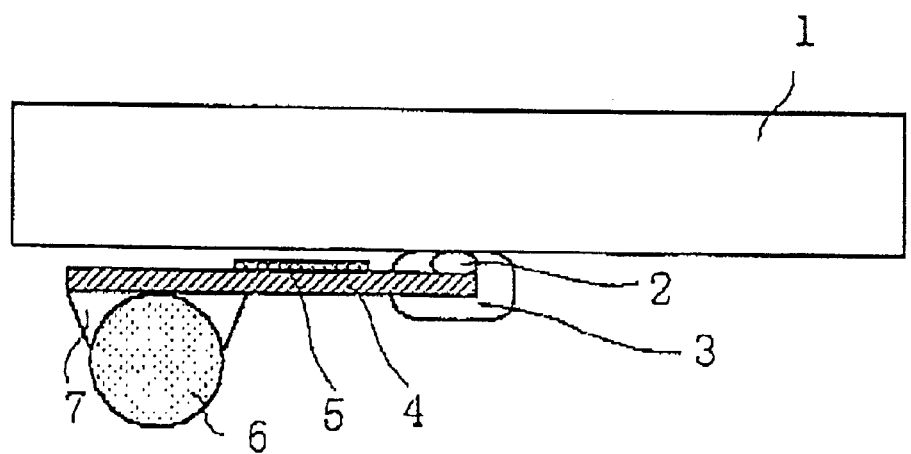

With reference to FIG. 8J, a liquid state resin material 7 is applied on the second ends of thee metal wiring layers 4. The liquid state resin material 7 has a flux function. Solder balls 6 are placed on the second ends of the metal wiring layers 4. The solder balls 6 comprise a tin-lead eutectic solder material. The semiconductor chip 1 is placed in a reflow chamber for carrying out a heat treatments at 150° C. for at least one minute and then heating up to 220° C. for subsequent cooling down, so that the solder balls 6 are bonded to the second ends of the metal wiring layers 4 as well as the resin material 7 is thermoset for reinforcing the junction between the solder balls 6 and the second ends of the metal wiring layers 4. Since the liquid state resin material 7 has a flux function, upon heat treatment, the liquid state resin material 7 is thermoset so that the melting solder balls 6 are restricted to any excess expansion over the metal wiring layers 4. The thermoset resin material 7 also reinforces the junction between the solder balls 6 and the second ends of the metal wiring layers 4.

Figure 8K:
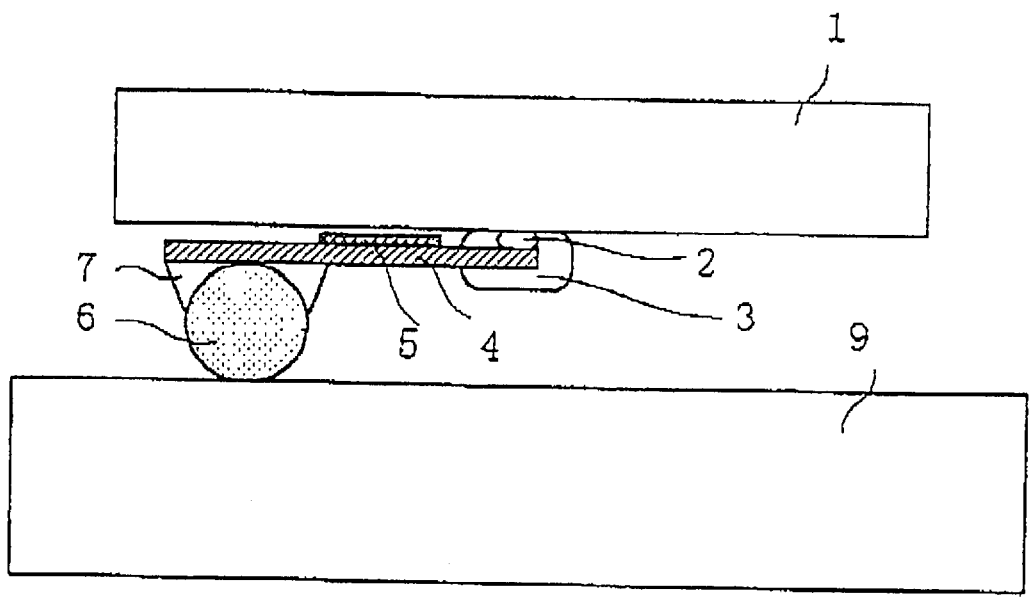

With reference to FIG. 8K, the semiconductor chip 1 is mounted onto the glass epoxy mounting board 9 having a thickness of 0.8 millimeters in the usual manner, whereby a semiconductor device is packaged.

A temperature-cycle test in the range of −40° C. to 125° C. is carried out. After 1000 cycles, no defect on electrical connection is recognized.

In accordance with the above novel method, after the base substrate 8 is peeled, the epoxy-based liquid state resin material 3 is easily applied selectively on the first ends of the metal wiring layers 4, the metal projections 2 and the electrode pads of the semiconductor chip 1. The fabrication process is thus simplified, FIGS. 9A through 9J are fragmentary cross sectional elevation views of semiconductor devices with the improved bonding structures in sequential steps involved in a second example of the fabrication method in accordance with the present invention. The views of the semiconductor devices are different by 90 degrees between FIGS. 9A through 9D and FEGS. 9E through 8J. In FIGS. 9E through 9J, right side bonding structures are not illustrated, even actually the left side and right side bonding structures are provided. FIGS. 9D and 9E are illustrative of the semiconductor device in one step, but FIG. 9E is a view from an arrow mark "A" in FIG. 9D.

Figure 9A:
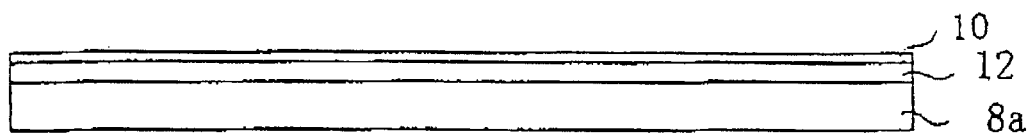
FIGS. 9A through 9J are fragmentary cross sectional elevation views of semiconductor devices with the improved bonding structures in sequential steps involved in a second example of the fabrication method in accordance with the present invention.

With reference to FIG. 9A, a base substrate 8a as a supporter is prepared, wherein the base substrate 8a may comprise a polyimide tape. A resist film 12 is applied on an entire top surface of the base substrate 8a. The resist film 12 is thermoset. A metal thin film 10 is formed on an entire upper surface of the resist film 12 by a sputtering method, wherein the metal thin film 10 may comprise a copper film.

Figure 9B:
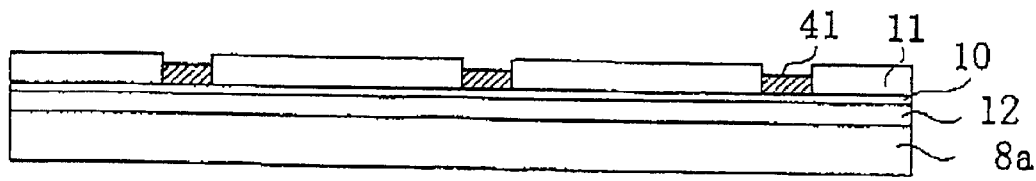

With reference to FIG. 9B, a resist pattern 11 is formed on the metal thin film 10 by lithography processes. Copper-plated layers 41 are selectively formed on the metal thin film 10 by an electro-plating method using the resist pattern 11 as a mask.

Figure 9C:
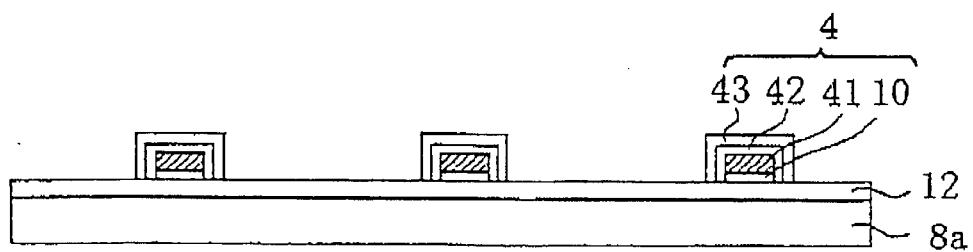
Figure 9D:
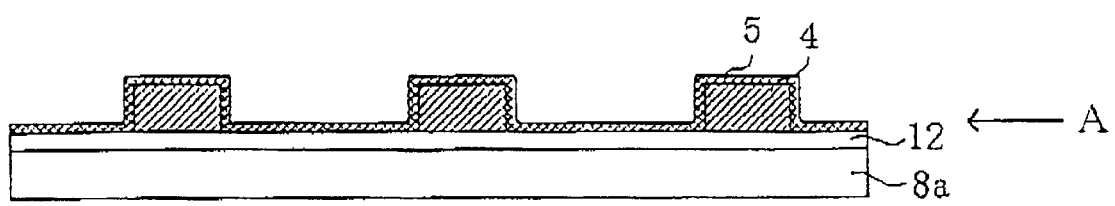
Figure 9E:
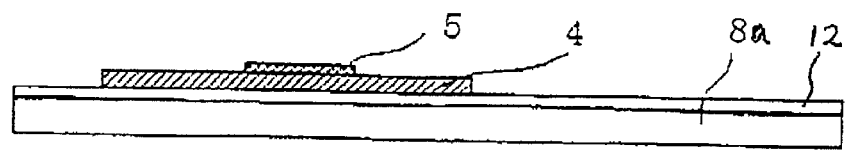

With reference to FIG. 9C, the resist pattern 11 is removed. The metal thin film 10 is then removed except under the copper-plated layers 41. Nickel-plated layers 42 are formed on surfaces of the copper-plated layers 41. Further, gold-plated layers 43 are formed on surfaces of the nickel-plated layers 42. Lamination structures of the metal thin film 10, the copper-plated layers 41, the nickel-plated layers 42 and the gold-plated layers 43 form wiring layers 4 which extend over the base layer 8.

With reference to FIGS. 9D and 9E, an epoxy-based liquid state resin material is applied selectively over the base layer 8 and the wiring layers 4. The applied epoxy-based liquid state resin material is then subjected to a heat treatment and a thermosetting process to form a supporting resin layer 5 which extends over the base layer 8 and the wiring layers 4.

Figure 9F:
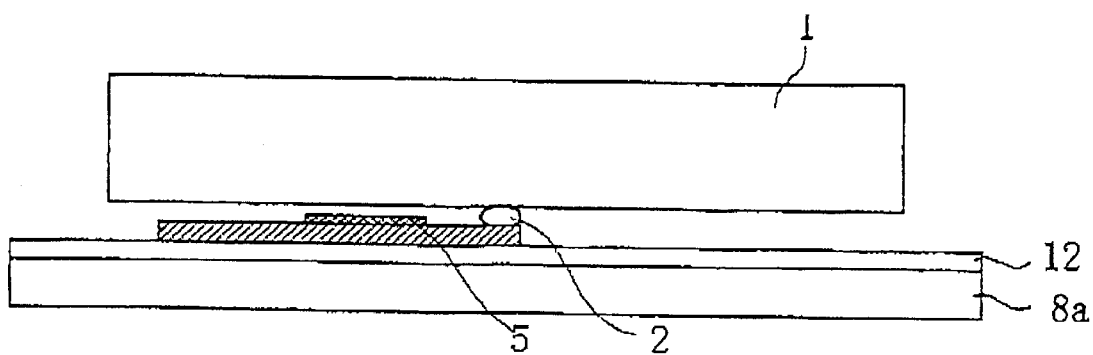

With reference to FIG. 9F, the base substrate 8 is aligned to a semiconductor chip 1 which has been formed with metal projections 2, so that the first ends of the metal wiring layers 4 are aligned to the metal projections 2. A heat treatment is carried out at 270° C., and a pressure of 50.96N (5.2 kg) is applied for 10 seconds between the semiconductor chip 1 and the base substrate 8, whereby the first ends of the metal wiring layers 4 are bonded to the metal projections 2.

Figure 9G:
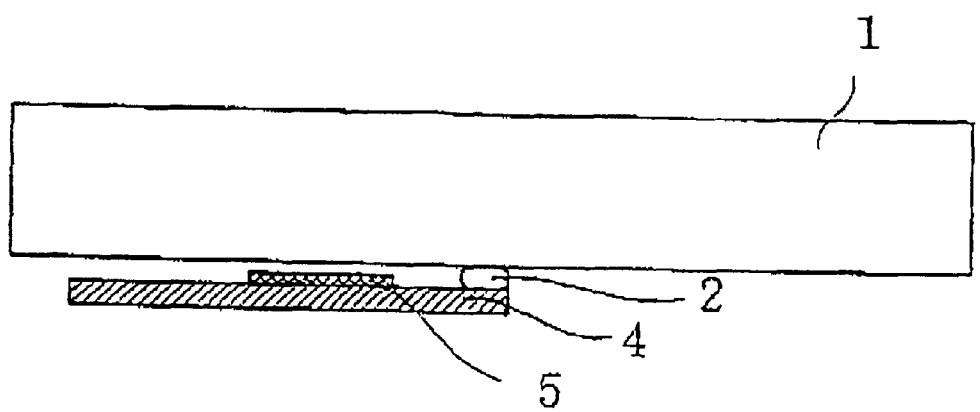

With reference to FIG. 9G, the resist film 12 is chemically dissolved so that the base substrate 8a and the resist film 12 are removed.

Figure 9H:
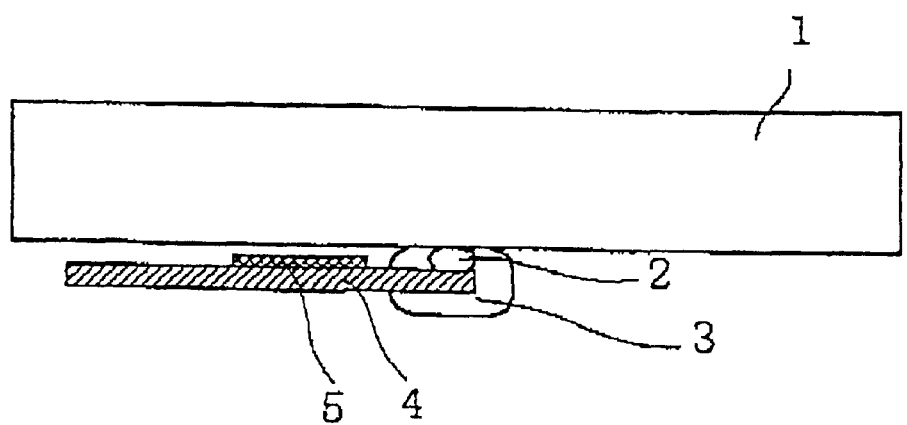

With reference to FIG. 9H, an epoxy-based liquid state resin material 3 is applied selectively on the first ends of the metal wiring layers 4, the metal projections 2 and the electrode pads of the semiconductor chip 1. The applied epoxy-based liquid state resin material 3 is then subjected to sequential thermosetting processes at 80° C. for 30 minutes and then at 150° C. for 120 minutes for forming sealing resins 3 which protect the junctions of the first ends of the metal wiring layers 4 through the metal projections 2 to the electrode pads.

Figure 9I:
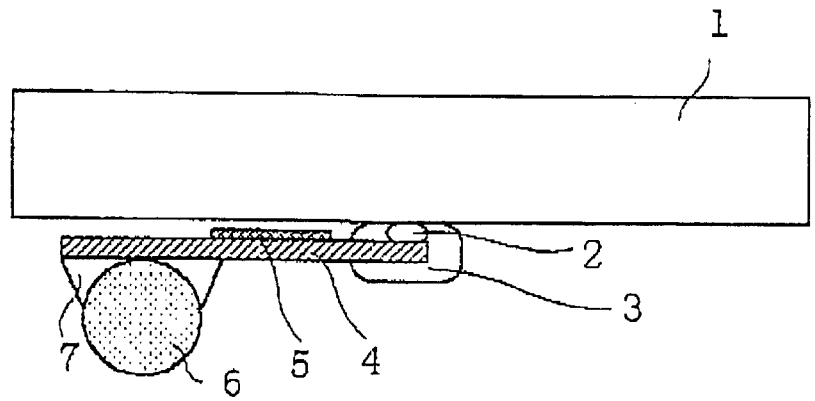

With reference to FIG. 9I, a liquid state resin material 7 is applied on the second ends of the metal wiring layers 4. The liquid state resin material 7 has a flux function. Solder balls 6 are placed on the second ends of the metal wiring layers 4. The solder balls 6 comprise a tin-lead eutectic solder material. The semiconductor chip 1 is placed in a reflow chamber for carrying out a heat treatments at 150° C. for at least one minute and then heating up to 220° C. for subsequent cooling down, so that the solder balls 6 are bonded to the second ends of the metal wiring layers 4 as well as the resin material 7 is thermoset for reinforcing the junction between the solder balls 6 and the second ends of the metal wiring layers 4. Since the liquid state resin material 7 has a flux function, upon heat treatment, the liquid state resin material 7 is thermoset so that the melting solder balls 6 are restricted to any excess expansion over the metal wiring layers 4. The thermoset resin material 7 also reinforces the junction between the solder balls 6 and the second ends of the metal wiring layers 4.

Figure 9J:
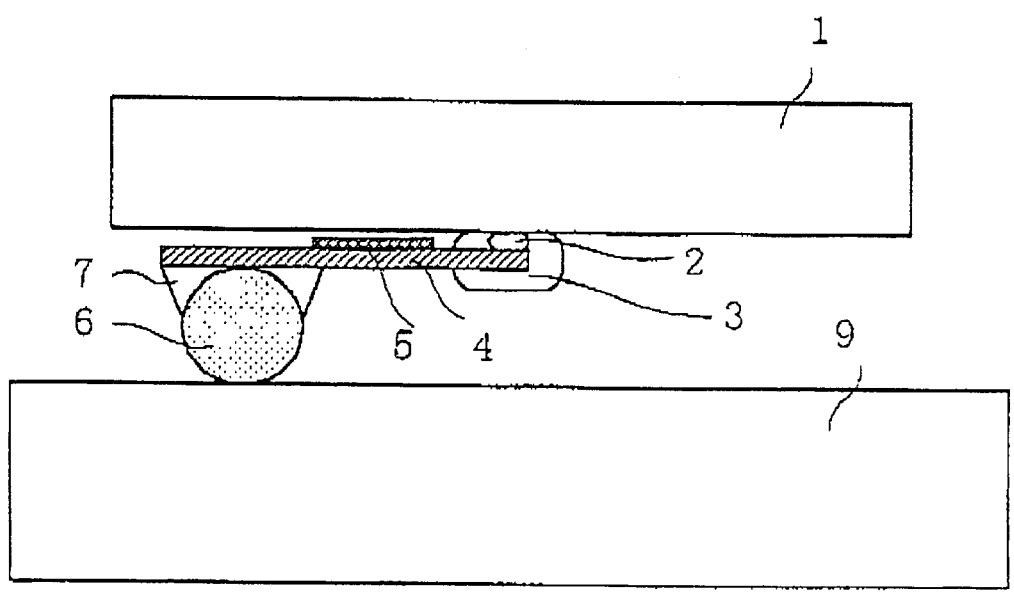

With reference to FIG. 9J, the semiconductor chip 1 is mounted onto the glass epoxy mounting board 9 having a thickness of 0.8 millimeters in the usual manner, whereby a semiconductor device is packaged.

A temperature-cycle test in the range of −40° C. to 125° C. is carried out. After 1000 cycles, no defect on electrical connection is recognized.

In accordance with the above novel method, after the base substrate 8 is peeled, the epoxy-based liquid state resin material 3 is easily applied selectively on the first ends of the metal wiring layers 4, the metal projections 2 and the electrode pads of the semiconductor chip 1. The fabrication process is thus simplified.

Figure 10A:
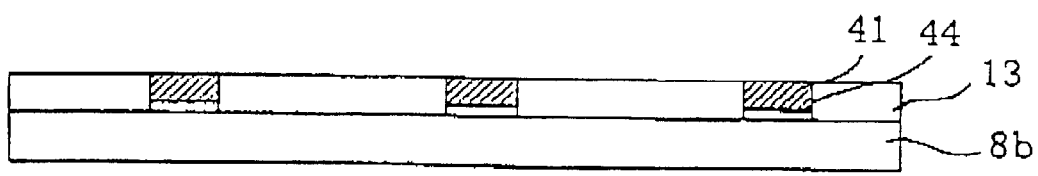
FIGS. 10A through 10K are fragmentary cross sectional elevation views of semiconductor devices with the improved bonding structures in sequential steps involved in a third example of the fabrication method in accordance with the present invention.
Figure 10B:
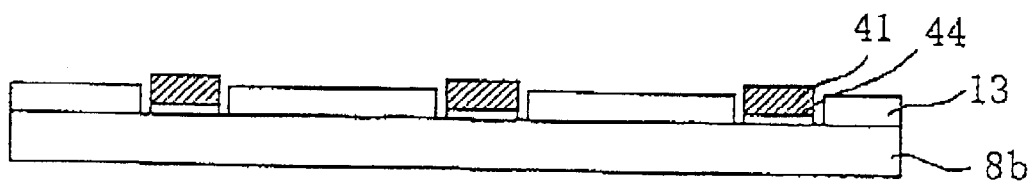
Figure 10C:
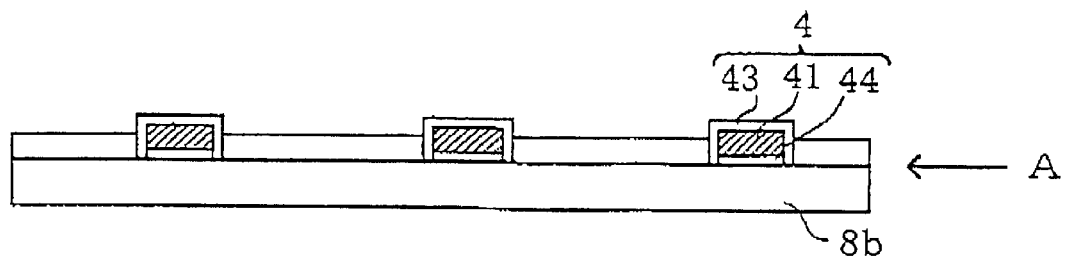
Figure 10D:
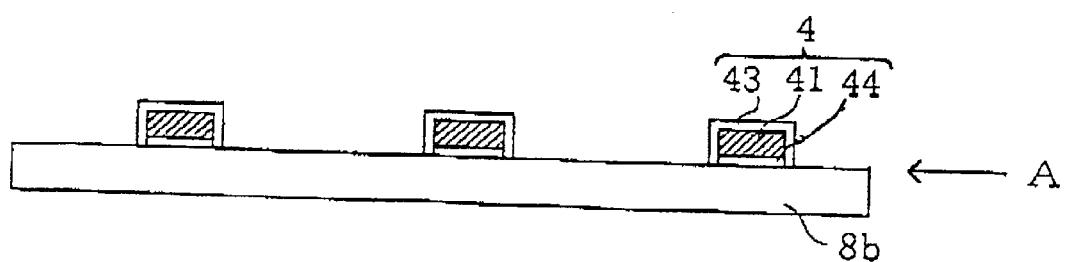
Figure 10E:
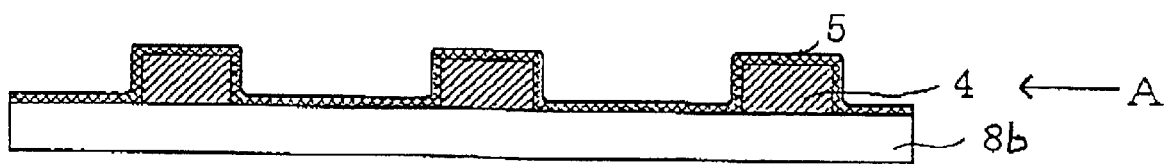
Figure 10F:
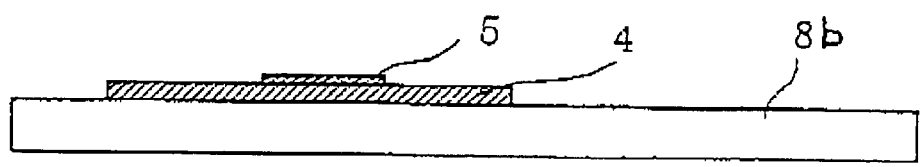
Figure 10G:
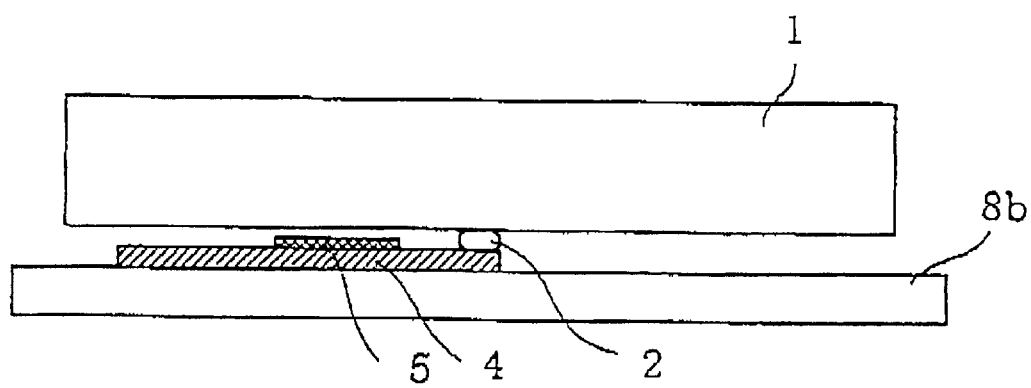

FIGS. 10A through 10K are fragmentary cross sectional elevation views of semiconductor devices with the improved bonding structures in sequential steps involved in a third example of the fabrication method in accordance with the present invention. The views of the semiconductor devices are different by 90 degrees between FIGS, 10A through 10E and FIGS. 10F through 10K. In FIGS. 10F through 10K, right side bonding structures are not illustrated, even actually the left side and right side bonding structures are provided. FIGS. 10E and 10F are illustrative of the semiconductor device in one step, but FIG. 10F is a view from an arrow mark "A" in FIG. 10E.

With reference to FIG. 10A, a base substrate 8b as a supporter is prepared, wherein the base substrate 8b may comprise a copper plate. A silicon oxide mask 13 is formed on the base substrate 8b by lithography processes. Gold-plated layers 44 and copper-plated layers 41 are sequentially and selectively formed on the base substrate 8b by an electroplating method using the silicon oxide mask 13.

With reference to FIG. 10B, the silicon oxide mask 13 is selectively etched by a buffered fluorine acid to form gaps between the silicon oxide mask 13 and the laminated gold-plated layers 44 and copper-plated layers 41.

With reference to FIG. 10C, gold-plated layers 43 are deposited by an electroplating method. Lamination structures of the gold-plated layers 44, copper-plated layers 41 and the gold-plated layers 43 form wiring layers 4 which extend over the base layer 8b.

With reference to FIG. 10D, the silicon oxide mask 13 is then removed.

With reference to FIGS. 10E and 10F, an epoxy-based liquid state resin material is applied selectively over the base layer 8b and the wiring layers 4. The applied epoxy-based liquid state resin material is then subjected to a heat treatment and a thermosetting process to form a supporting resin layer 5 which extends over the base layer 8b and the wiring layers 4.

With reference to FIG, 10G, the base substrate 8b is aligned to a semiconductor chip 1 which has been formed with metal projections 2, so that the first ends of the metal wiring layers 4 are aligned to the metal projections 2. A heat treatment is carried out at 270° C., and a pressure of 50.96N (5.2 kg) is applied for 10 seconds between the semiconductor chip 1 and the base substrate 8b, whereby the first ends of the metal wiring layers 4 are bonded to the metal projections 2.

Figure 10H:
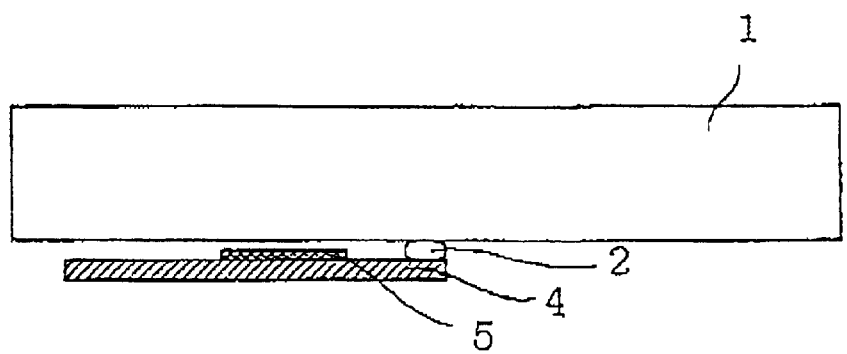

With reference to FIG. 10H, the base substrate 8b is etched by an etchant including ferric chloride.

Figure 10I:
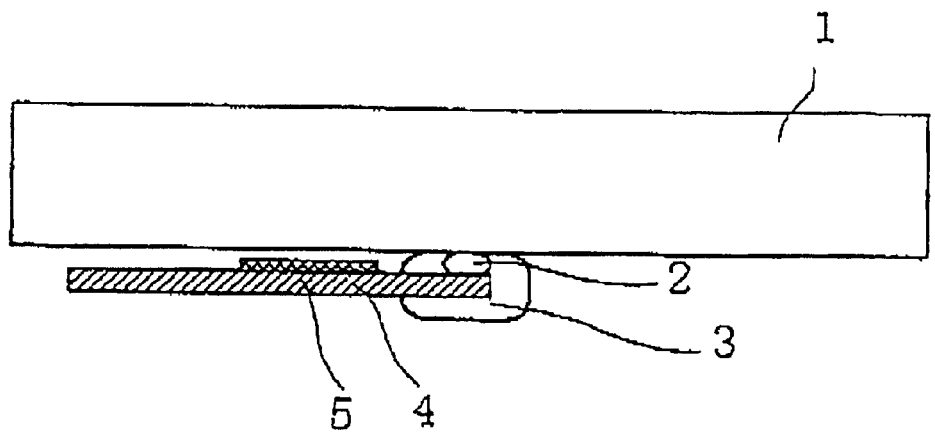

With reference to FIG. 10I, an epoxy-based liquid state resin material 3 is applied selectively on the first ends of the metal wiring layers 4, the metal projections 2 and the electrode pads of the semiconductor chip 1. The applied epoxy-based liquid state resin material 3 is then subjected to sequential thermosetting processes at 80° C. for 30 minutes and then at 150° C. for 120 minutes for forming sealing resins 3 which protect the junctions of the first ends of the metal wiring layers 4 through the metal projections 2 to the electrode pads.

Figure 10J:
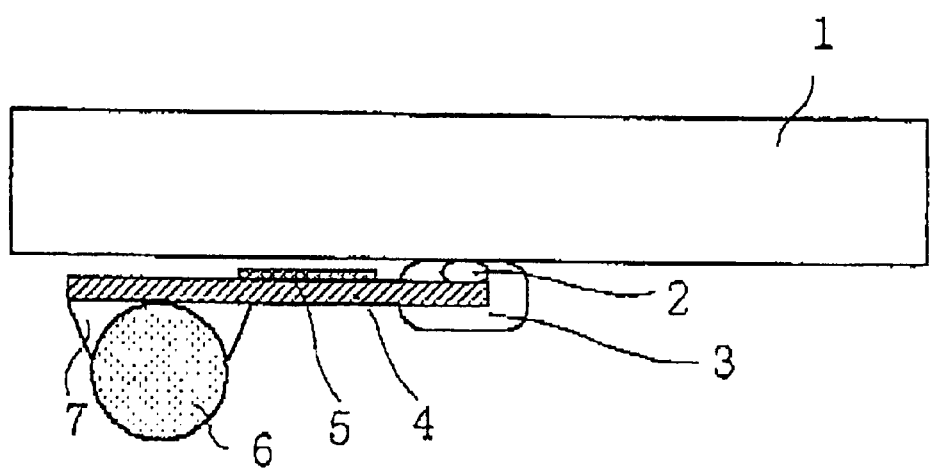

With reference to FIG. 10J, a liquid state resin material 7 is applied on the second ends of the metal wiring layers 4. The liquid state resin material 7 has a flux function. Solder balls 6 are placed on the second ends of the metal wiring layers 4. The solder balls 6 comprise a tin-lead eutectic solder material. The semiconductor chip 1 is placed in a reflow chamber for carrying out a heat treatments at 150° C. for at least one minute and then heating up to 220° C. for subsequent cooling down, so that the solder balls 6 are bonded to the second ends of the metal wiring layers 4 as well as the resin material 7 is thermoset for reinforcing the junction between the solder balls 6 and the second ends of the metal wiring layers 4. Since the liquid state resin material 7 has a flux function, upon heat treatment, the liquid state resin material 7 is thermoset so that the melting solder balls 6 are restricted to any excess expansion over the metal wiring layers 4. The thermoset resin material 7 also reinforces the junction between the solder balls 6 and the second ends of the metal wiring layers 4.

Figure 10K:
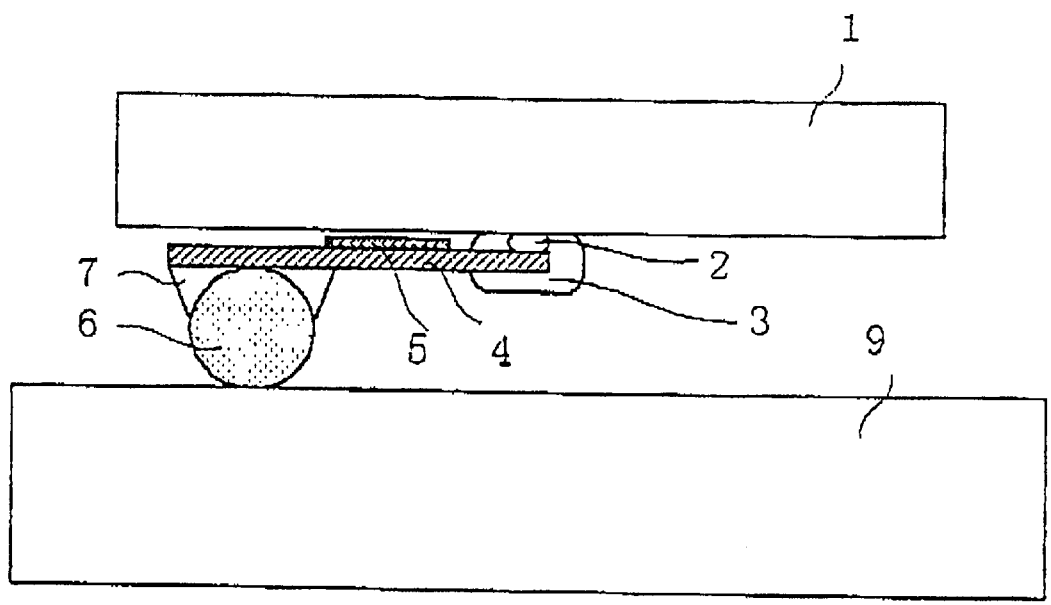

With reference to FIG. 10K, the semiconductor chip 1 is mounted onto the glass epoxy mounting board 9 having a thickness of 0.8 millimeters in the usual manner, whereby a semiconductor device is packaged.

A temperature-cycle test in the range of −40° C. to 125° C. is carried out. After 1000 cycles, no defect on electrical connection is recognized.

In accordance with the above novel method, after the base substrate 8b is peeled, the epoxy-based liquid state resin material 3 is easily applied selectively on the first ends of the metal wiring layers 4, the metal projections 2 and the electrode pads of the semiconductor chip 1. The fabrication process is thus simplified.

The above examples may be modified by any available measures which have been known in the art to which the present invention.

For example, in the above examples, the epoxy-base resin material is used. It is, however, possible to use any available polyimide-base resin materials.

The base substrate may comprise a thermoplastic resin substrate, wherein the base substrate is removed by dissolving the same. The base substrate, may also comprise a glass substrate, wherein the base substrate is removed by etching the same.

For forming the electrically conductive thin film on the insulating base substrate, not only the electroless plating method and sputtering method but also evaporation methods are also available.

In the third example, the silicon oxide mask is selectively removed to form gaps between the mask and the wiring layers. This process is also applied to the first and second examples. The silicon oxide mask may be replaced by a resist mask.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device comprising:
   a semiconductor chip having a plurality of electrode pads;
   a plurality of solder balls;
   a plurality of metal wiring layers extending generally in parallel to a surface of said semiconductor chip, said metal wiring layers electrically and mechanically bonding said solder balls to said electrode pads; and
   a mounting board bonded with said solder balls,
   wherein said metal wiring layers have a flexibility and allow a relative displacement of said mounting board in relation to said semiconductor chip,
   wherein said metal wiring layers comprise first set wiring layers and second set wiring layers,
   wherein said first set wiring layers extend in a first direction and are adhered to a first common supporting layer for keeping said first set wiring layers extending in parallel to each other, and
   wherein said second set wiring layers extend in a second direction anti-parallel to said first direction and said second set wiring layers are adhered to a second common supporting layer for keeping said second set wiring layers extending in parallel to each other.

2. The semiconductor device as claimed in claim 1, wherein each of said metal wiring layers has a fixed end which is connected through a metal protection to each of said electrode pads, and each of said metal wiring layers has a free end being fixed with each of said solder balls.

3. The semiconductor device as claimed in claim 2, wherein each of said fixed ends are sealed with a continuous sealing resin layer.

4. The semiconductor device as claimed in claim 2, wherein said solder balls and said free ends are reinforced by a reinforcement resin material.

5. The semiconductor device as claimed in claim 1, wherein each of said metal wiring layers extends in a straight form.

6. The semiconductor device as claimed in claim 1, wherein each of said wiring layers follows a zigzag path across said surface in plan view.

7. The semiconductor device as claimed in claim 1, wherein said common supporting layer is made of an insulating material.

8. The semiconductor device as claimed in claim 1, wherein said wiring layers have a uniform length.

9. The semiconductor device as claimed in claim 1, wherein said first set wiring layers comprise short and long wiring layers which are alternately aligned in the first direction, and
   wherein said short and long wiring layers are adhered to said first common supporting layer and said long wiring layers are adhered to a third common supporting layer which is positioned outside said first common supporting layer for keeping said short and long wring layers extending in parallel to each other.

10. A semiconductor device comprising:
a semiconductor chip having a plurality of electrode pads;
a plurality of solder balls;
a plurality of metal wiring layers extending generally in parallel to a surface of said semiconductor chip, said metal wiring layers electrically and mechanically bonding said solder balls to said electrode pads; and
a mounting board bonded with said solder balls,
wherein said metal wiring layers have a flexibility and allow a relative displacement of said mounting board in relation to said semiconductor chip,
wherein said metal wiring layers comprise first set wiring layers having a first length, second set wiring layers having a second length longer than said first length, third set wiring layers having a third length and fourth set wiring layers having a fourth length longer than said third length,
wherein said first and second set wiring layers are alternately aligned in a direction perpendicular to a first direction, along which said first and second set wiring layers extend,
wherein said third and fourth set wiring layers are alternately aligned in a direction perpendicular to a second direction, along which said third and fourth set wiring layers extend, and said second direction being antiparallel to said first direction,
wherein said first and second set wiring layers are adhered to a first supporting layer and said second set wiring layers are adhered to a second common supporting layer which is positioned outside said first common supporting layer for keeping said first and second set wiring layers extending in parallel to each other, and
wherein said third and fourth set wiring layers are adhered to a third common supporting layer and said fourth set wiring layers are adhered to a fourth common supporting layer which is positioned outside said third common supporting layer for keeping said third and fourth set wiring layers extending in parallel to each other.

11. The semiconductor device as claimed in claim 10, wherein said wiring layers extend in a straight form.

12. A semiconductor device comprising:
a semiconductor chip having plural electrical contacts on a surface thereof;
plural flexible wiring layers that are attached to said semiconductor chip and that extend generally parallel to said surface, each of said plural wiring layers having a fixed end attached to a respective one of said plural electrical contacts and a free end that is free to move in relation to said surface, each of said plural wiring layers having a central portion extending from said fixed end to said free end that also is free to move in relation to said surface;
plural solder structures that are each attached to a respective said free end; and
a common su porting layer that is attached to each said central portion of said plural wiring layers, an entirety of said common supporting layer being separate from said surface and moving with said cent al portion in relation to said surface.

13. The semiconductor device as claimed in claim 12, further comprising a mounting board bonded to said solder structure.

14. The device of claim 12, wherein first ones of said plural wiring layers extend in a first direction and second ones of said plural wiring layers extend in a second direction generally opposite to the first direction, and wherein a first said common supporting layer is attached to said first ones and a second said common supporting layer is attached to said second ones.

15. The device of claim 12, wherein said plural wiring layers extend in parallel straight lines.

16. The device of claim 12, wherein each of said plural wiring layers has a zigzag course across said surface in plan view.

17. The device of claim 12, wherein first ones of said plural wiring layers extend in a first direction and second ones of said plural wiring layers extend in the first direction interleaved with said first ones, and wherein a first said common supporting layer is attached to said first ones and a second said common supporting layer is attached to said second ones.

18. The device of claim 17, wherein said first ones are longer than said second ones.

19. The device of claim 17, wherein third ones of said plural wiring layers extend in a second direction opposite the first direction and fourth ones of said plural wiring layers extend in the second direction interleaved with said third ones, and herein a third said common supporting layer is attached to said third ones and a fourth said common supporting layer is attached to fourth second ones.

20. The device of claim 12, wherein said plural solder structures are solder balls.

21. The device of claim 12, further comprising a continuous sealing resin layer that covers each said fixed end of said plural wiring layers, said continuous sealing resin layer being separate from said common supporting layer.

22. A semiconductor device comprising:
a semiconductor chip having plural electrical contacts on a surface thereof;
plural flexible wiring layers that are attached to said semiconductor chip and that extend generally parallel to said surface, each of said plural wiring layers having a fixed end attached to a respective one of said electrical contacts and a free end that is free to move in relation to said surface, said wiring layer having central portion extending from said fixed end to said free end that also is free to move in relation to said surface;
plural solder structures that are each attached to a respective said free end; and
said central portion of each of said plural wiring layers having a zigzag course across said surface in plan view.

23. The device of claim 22, wherein first ones of said plural wiring layers extend in a first direction and second ones of said plural wiring layers extend in a second direction generally opposite to the first direction, and wherein a first said common supporting layer is attached to said first ones and a second said common supporting layer is attached to said second ones.

24. The device of claim 22, wherein said plural solder structures are solder balls.

25. The device of claim 22, further comprising a continuous sealing resin layer that covers each said fixed end of said plural win layers.

26. A method of making a semiconductor device comprising the steps of:
providing a semiconductor chip having plural electrical contacts on a surface thereof;
attaching plural flexible wiring layers to the semiconductor chip, he plural wiring layers extending generally parallel to the surface, each of the plural wiring layers being attached by attaching a fixed end to a respective one of the plural electrical con acts and leaving a free end free to move in relation to the surface, where each of the plural wiring layers has a central portion extending from the fixed end to the free end that also is free to move in relation to the surface;

attaching a solder structure respectively to each free end; and attaching common supporting layer to each central portion of the plural wiring layers, an entirety of the common supporting layer being separate from the surface and moving with the central portion in relation to the surface.

27. The method of claim 26, further comprising the steps of attaching first ones of the plural wiring layers that extend in a first direction to a first common supporting layer and attaching second ones of the plural wiring layers that extend in a second direction generally opposite to the first direction to a second common supporting layer.

28. The method of claim 26, wherein the plural wiring layers are extended in parallel straight lines.

29. The method of claim 26, wherein each of the plural wiring layers is given a zigzag course across the surface in plan view.

* * * * *